US006382740B1

(12) United States Patent
Peichl et al.

(10) Patent No.: US 6,382,740 B1
(45) Date of Patent: May 7, 2002

(54) PROTECTIVE CIRCUIT FOR A CONTROLLING ELEMENT AND METHOD FOR TESTING THE CONTROL CIRCUIT OF A CONTROLLING ELEMENT

(75) Inventors: Thomas Peichl, Wöllstadt; Gerhard Möheken, Usingen; Artur Schönbein, Frankfurt am Main, all of (DE)

(73) Assignee: Continental Teves AG & Co., oHG, Frankfurt (DE)

( * ) Notice: Subject to any disclaimer, the term of this patent is extended or adjusted under 35 U.S.C. 154(b) by 0 days.

(21) Appl. No.: 09/554,645

(22) PCT Filed: Nov. 20, 1998

(86) PCT No.: PCT/EP98/07469

§ 371 Date: Aug. 11, 2000

§ 102(e) Date: Aug. 11, 2000

(87) PCT Pub. No.: WO99/26827

PCT Pub. Date: Jun. 3, 1999

(30) Foreign Application Priority Data

Nov. 21, 1997 (DE) ........................................ 197 51 602
Nov. 21, 1997 (DE) ........................................ 197 51 606
Jun. 16, 1998 (DE) ........................................ 198 26 685

(51) Int. Cl.[7] ................................................ B60T 8/88
(52) U.S. Cl. ................................ 303/122.08; 303/156
(58) Field of Search ...................... 303/122.08, 122.05, 303/122.11, 155, 113.4, 119.1, 156; 188/1.11 E; 363/41; 307/130; 318/564

(56) References Cited

U.S. PATENT DOCUMENTS 3,663,879 A * 5/1972 Salamon et al. ............ 318/564
5,010,972 A 4/1991 Ingraham et al.
5,083,075 A 1/1992 Sato et al.
5,499,866 A * 3/1996 Brugger et al. ........ 303/122.08
5,763,963 A * 6/1998 Zydek et al. ............... 307/130

FOREIGN PATENT DOCUMENTS

| | | |
|---|---|---|
| DE | 29 38 344 | 4/1981 |
| DE | 39 28 651 | 3/1991 |
| DE | 40 05 299 | 8/1991 |
| DE | 44 25 578 | 1/1996 |
| DE | 195 34 833 | 4/1996 |
| WO | 96 11129 | 4/1996 |

* cited by examiner

*Primary Examiner*—Christopher P. Schwartz
*Assistant Examiner*—Melanie Torres
(74) *Attorney, Agent, or Firm*—Rader, Fishman & Grauer PLLC

(57) ABSTRACT

The invention relates to a circuit arrangement of a circuit of an electrically controlled brake force booster, including a first and a second line that supply two potentials to the connections of the actuator, an electronically actuated first switch provided in the first line, a control device that switches the first switch with a first, preferably pulse-width modulated, control signal, and an electronically actuated second switch provided in the second line, wherein the control circuit switches the second switch with a second control signal. A process for testing this circuit arrangement includes the step of testing at least one potential on at least one connection of the actuator when both switches are open.

19 Claims, 4 Drawing Sheets

100a
100
100b
226
102
206
104
224a
233
223
Vcc
225
224b
232
PWM
109
S1
221a
221b
237
103
222
205
P3
S2
P2
P1
S1'
S1'
231
230
101
235
238
236
239

| FAULT | MODE 0<br>105 OFF<br>106 OFF | MODE 1<br>105 ON<br>106 OFF | MODF 2<br>105 ON<br>106 ON (PULSED) |
|---|---|---|---|
| 105 OPEN | | P1 < 3,6 V | |
| 105 SHORT-CIRCUIT (JUMPER) | P2 > 2,8 V | | |
| 100a SHORT-CIRCUIT WITH 12V | P2 > 2,8 V | | |
| 100a SHORT-CIRCUIT AFTER GROUND | P2 < 1,0 V | | |
| 100b SHORT-CIRCUIT WITH 12V | P2 > 2,8 V | | |
| 100b SHORT-CIRCUIT AFTER GROUND | P2 < 1,0 V | ( P1 < 1,0 V ) | |
| 100 HIGH-RESISTANCE CONNECTION OPEN | | P1 < 1,0 V | |
| 100 SHORT-CIRCUIT | | | P1 > 0,5 V |
| 106 OPEN | | | P1 > 0,5 V |
| 106 SHORT-CIRCUIT (JUMPER) | P2 < 1,0 V | ( P1 < 1,0 V ) | |
| LEAKAGE CURRENT AFTER 12V | P2 > 2,8 V | | |
| LEAKAGE CURRENT AFTER GROUND | P2 < 1 0,V | | |

PROTECTIVE CIRCUIT FOR A CONTROLLING ELEMENT AND METHOD FOR TESTING THE CONTROL CIRCUIT OF A CONTROLLING ELEMENT

TECHNICAL FIELD

The present invention generally relates to actuator circuits and more particularly relates to electrically actuated actuator with two connections, with such an actuator preferably being an electromechanically actuated device having a solenoid, a coil or similar element.

BACKGROUND OF THE INVENTION

In particular, actuators for safety-critical applications are commonly used in vehicles. An electronically controlled brake force booster is such an actuator. Like a conventional brake force booster, it comprises the actual, pneumatically driven boosting element which, however, is not driven directly mechanically when the brake pedal is pushed down, but through an electrically actuated valve that either ventilates or does not ventilate the vacuum side according to electric signals. Hence, the operation of the electrically actuated ventilation valve directly affects the brake reaction of the vehicle, so that, on the one hand, it is desired that this ventilation valve or actuator always works perfectly and, on the other hand, it must be ensured that testing such an actuator does not lead to undesired actuations of the brake system of a vehicle.

DE-OS 44 25 578 provides a schematic representation of a brake system with an electrically controlled brake force booster. However, it does not state how the components of the electric activation of the valve can be tested reliably on the one hand, and uncritically as far as the brake reaction of the vehicle is concerned on the other hand.

The object of the present invention is to disclose a circuit arrangement for an actuator or a method for testing the circuit arrangement of an actuator, on the basis of which the electric or electronic components can be tested simply, reliably and uncritically as far as the brake reaction of the vehicle is concerned.

Prior to describing individual embodiments of the invention, possible faults are described on the basis of FIG. 1. In FIG. 1 reference number 100 is the actuator under review or its electric components, in particular, for example, a solenoid, a coil, an electric motor or similar element. The actuator has two connections 100*a* and 100*b*. This actuator can be connected between potentials 101, 102 by means of its connections 100*a*, 100*b*. For example, 102 can be ground, 101 can be the battery supply voltage (usually 12V) or another suitable voltage. In conventional systems the operation of actuator 100 is controlled by means of a switch: The actuator works when the switch is closed and it rests when the switch is open. Various faults may occur as follows.

The switch may have a short-circuit or it may not close anymore. One of the connections 100*a*, 100*b* of actuator 100 may have a short-circuit with respect to one of the potentials 101, 102. Actuator 100 has an internal break or short-circuit. Finally, leakage currents towards the above-mentioned potentials may occur through high-resistance parallel connections. Most of the above-mentioned faults will immediately affect the performance of the actuator and should be detected as soon as possible in order to avoid insecure operating states.

Thus, a circuit arrangement that allows frequent testing of the actuator is desired. On the one hand, such testing, in particular, should be possible when the actuator could be potentially used, in other words while a vehicle is driving. On the other hand, it must be ensured that the testing does not lead to undesired intervention, e.g. undesired brake actuation.

Accordingly, the present invention discloses a circuit arrangement comprising two electronically actuated switches on each of the connections of the actuator. When activating the actuator in the conventional way, one of the switches can be closed firmly and another switch can be activated in accordance with other control criteria. During testing operations one switch can remain open and another can be closed, so that faults can be detected through the potential states.

BRIEF DESCRIPTION OF THE PREFERRED EMBODIMENTS

FIG. 3 is a table showing different fault states and how they can be detected.

DETAILED DESCRIPTION OF THE PREFERRED EMBODIMENTS

Figure 1:
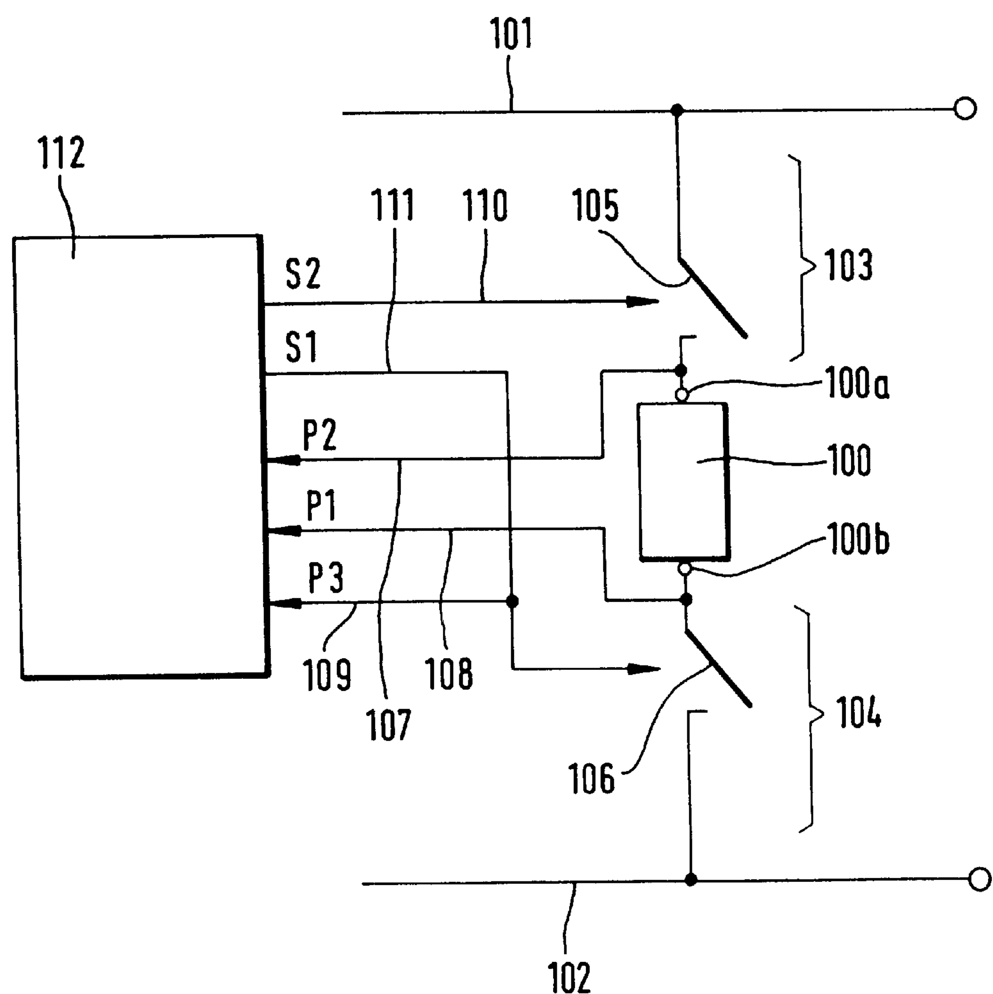
FIG. 1 is a schematic representation of a first embodiment according to the invention.

FIG. 1 shows a first embodiment according to the invention. 100 is the actuator or the associated electric component, e.g. a solenoid, a coil, an electric motor or similar device. It has connections 100*a* and 100*b*. A switch 105, 106 is provided at each side of the actuator 100. Switch 105 is located in line 103 between connection 100*a* and potential 101, whereas switch 106 is located in line 104 between connection 100*b* and potential 102. Switches 105, 106 preferably are electronically actuated switches, for example FETs, power FETs, thyristors, GTOs or similar switches. Switches 105, 106 are switched according to control signals S1, S2, which are supplied to the switches via lines 111, 110. In conventional applications of the actuator (for example light braking) it may be, for example, that a control signal S2 is supplied to switch 105 via line 110, causing it to close for a longer period of time. Contrary to this, signal S1 is supplied to switch 106 via line 111, so that actuator 100 is actuated in a desired manner. For example, signal S1 can be a pulse-width modulated signal generated according to the desired brake force. Thus, the electronically actuated switch 106 is opened and closed at a comparably high frequency, so that a desired mean current is set through actuator 100. However, instead of a pulse-width modulated signal, other signals may be provided, for example an analog signal that switches switch 106 analog, i.e. opens it more or less wide to set a desired current, for example.

Furthermore, one or several of the test signal feedbacks described below are provided for testing electric values or time ratios: Test signal P1 on line 108, which is picked up near connection 100*b* of actuator 100; test signal P2 on line 107, which is picked up near connection 100*a* of actuator 100; and test signal 109 which corresponds to the first control signal.

When actuator 100 or its circuit arrangement is to be tested, switches 105, 106 can first be actuated in a suitable manner before testing test signals P1 to P3 on signal lines 107 to 109.

Different modes of testing can be set for testing the above-mentioned possible faults, for example, Mode 0, where both switches 105, 106 are open; Mode 1, where one switch is closed and another one is open (so that the actuator is not activated electrically yet); and Mode 2, where one switch is closed and the other is closed for such a short time that the actuator is not activated significantly.

These modes will be explained in more detail later with reference to FIG. 3.

In view of the fact that two switches are provided, it is possible to disconnect both connections 100*a*, 100*b* of actuator 100 from the respective potentials 101, 102 (see Mode 0 above), so that various fault conditions, which could not be detected or could be detected only with great difficulty without such disconnection, can now be detected. In addition, when two switches are provided, one can be kept closed and another be kept open, so that other faults can be detected (Mode 1) without there being any brake intervention.

Figure 2:
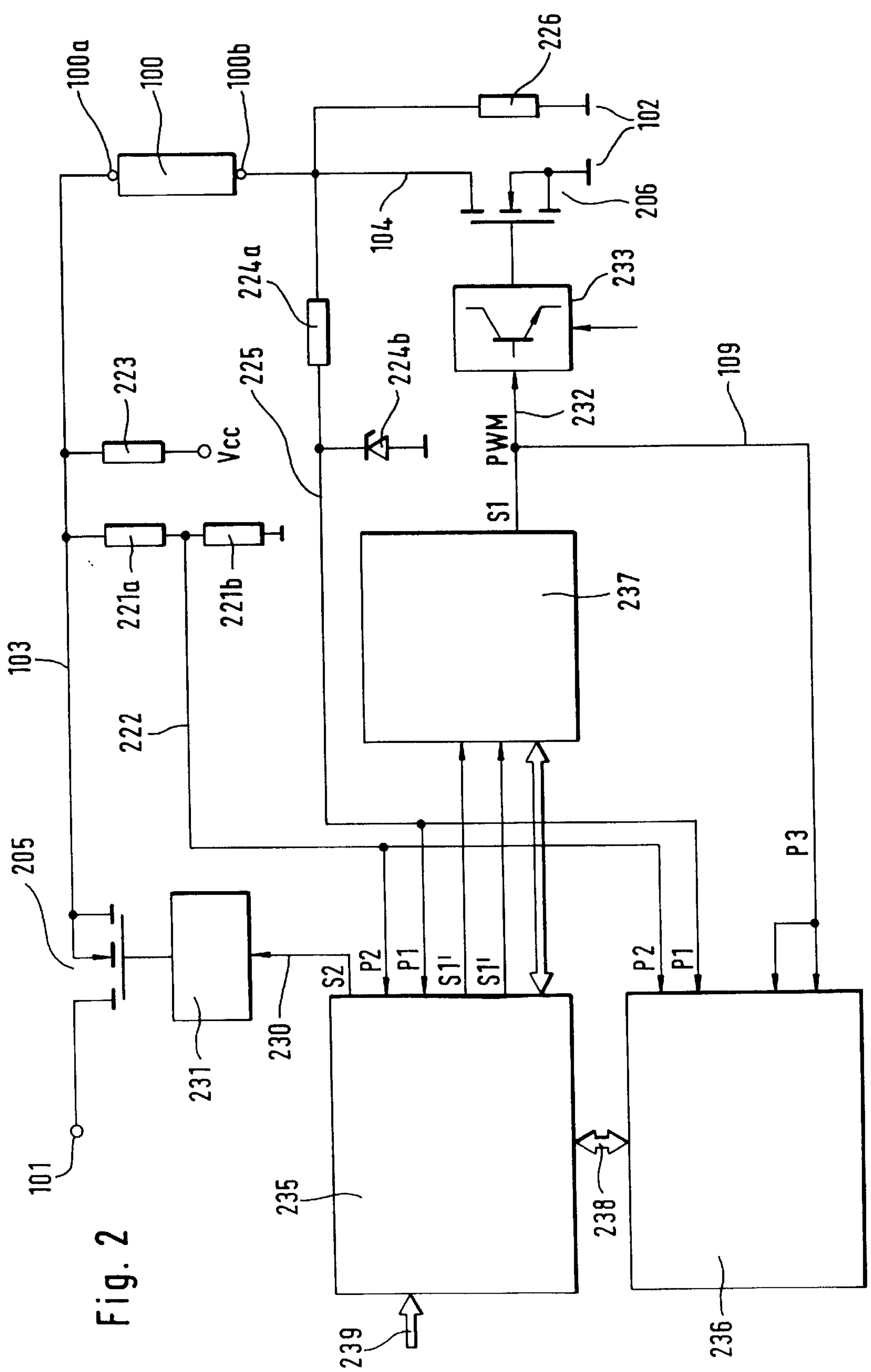
FIG. 2 is a schematic representation of another embodiment according to the invention.

A more detailed embodiment is described with reference to FIG. 2, with the same reference numbers as those in FIG. 1 referring to similar components. 205 is a switch designed as an FET and corresponds to switch 105 in FIG. 1, the same applies correspondingly for switch 206. Driver circuits 231, 233 are provided for the activation.

Signals S1, S2, on the basis of which switches 205, 206 are activated, are generated in a suitable way through a control circuit 112, 235–237. Components 235–237 in FIG. 2 essentially correspond to control circuit 112 in FIG. 1. The first control signal S1 is fed back to a signal monitoring circuit 236 by way of line 109 as test signal P3. In the same way, the potentials near connections 100*a*, 100*b* of the actuator are picked up and fed back to signal monitoring circuit 236 as test signals P1, P2 by way of return lines 221, 222 or 224, 225. Resistors 221*a* and 221*b* act as voltage dividers that serve to adjust the valves of signal state P2. Resistors 223 and 226 exhibit a comparably high resistance and set the terminals 100*a*, 100*b* of the actuator 100 to defined values when switches 205, 206 are open. Together with the ohmic resistance of coil 100 the resistors 223, 226 also act as voltage dividers.

Processing device 235 receives superior signals 239 and generates a first output signal S1' according to these signals, with this first output signal S1' being used as the input signal of a generation device 237. The generation device 237 generates the actual first control signal S1, which preferably is pulse-width modulated and digital. However, it can also be an analog signal that opens a transistor more or less wide.

The processing device 235 communicates with the signal monitoring device 236 via data lines 238.

The monitoring device 236, whose exact structure will be explained later with reference to FIG. 4, on the one hand can monitor the signal states in lines P1 and P2 and on the other hand it can check the correctness of the control signal S1. If, for example, control signal S1 is a pulse-width modulated signal, processing device 235 can hold switch 205 open and can generated a pulse-width modulated signal S1 with a known pulse width ratio for switch 206. Then monitoring device 236 checks whether signal S1 is generated as expected, for example (for pulse-width modulated signals) by checking the time-related position of edges or (for example for an analog control signal) checking the state of the signal.

Different fault conditions and how they can be detected will now be described on the basis of FIG. 3. The stated threshold values should be understood as examples; they are defined by the dimensions of the individual resistors in the circuit arrangement shown in FIG. 2. The faults shown in FIG. 3 concern faults in the circuit arrangement of the actuator or in the actuator itself, which can be detected with test signals P1, P2. The above-mentioned modes can be set during the test. In Mode 0 both switches 105, 106 or 205, 206 are open, provided they are operating properly. Connections 100*a* or 100*b* of actuator 100 are pulled to defined potentials via resistors 223 or 226, with such potentials differing from potentials 101, 102. If one of the switches has a short-circuit, this can be detected because the potential 101 or 102 is applied to terminals 100*a*, 100*b* even though switch 205, 206 theoretically should be open. Similarly short-circuits in connection 100*a* after ground 102 or connection 100*b* leading to the supply voltage can be detected. A ground short-circuit of connection 100*a* is detected by a very low potential at this connection. Or, put differently, the short-circuit of connection 100*b* towards the supply voltage can be detected by a very high potential both at connection 100*b* and connection 100*a*. In this connection it should be pointed out that it is not absolutely necessary to distinguish between individual faults. It is important, however, that suitable measures be executed as soon as a fault occurs, irrespective of the exact nature of the fault.

Leakage currents can be detected in a manner similar to the short-circuits of connection 100*a*, 100*b* towards one of the potentials when both switches are open. Such leakage currents also affect the potentials at the terminals, so that these can be determined by means of appropriate threshold value settings and by checking the potential at lines 222, 225.

For example, in Mode 1 switches 105, 205 can be closed and switches 105, 206 can be open. In this way, it can be determined whether switch 105, 205 closes. If not, the potential at terminal 100*a* will not assume the required value, so that this is passed on to the signal monitoring device 236 by voltage divider 221*a, b* and line 222 in the form of a test signal P2. The (already in Mode 0) recognizable short-circuit of connection 100*b* of actuator 100 can be detected by a very low state of test signal P1. The same holds true for an interruption in the coil itself. The high potential 101 passed on to connection 100*a* via the closed switch 205 does not become evident at connection 100*b*, so that test signal P1 remains under a threshold value.

As already mentioned in connection with Mode 0, a short-circuit of switch 206 is detected because then connection 100*b* is pulled to the low ground potential 102 even though switch 206 should be open.

Finally, in Mode 2 both switches 105, 106 or 205, 206 are closed. This mode is critical in so far as it causes current to be applied to the actuator and, consequently, the actuator is activated. Thus, it is advantageous to set this mode for a short time only, for example by closing switch 106, 206 only very briefly in addition to the already closed switch 105, 205. In Mode 2 it will become evident if switch 106, 206 does not switch because then the potential at connection 100*b* will no longer be connected to ground, but remains above a threshold value. A short-circuit of the actuator 100 can be detected according to the same criteria. Due to the short-circuit the expected voltage at actuator 100 will not drop, so that connection 100*b* once again will not assume any potential approximately equal to ground, but will remain above a threshold value.

The modes described with reference to FIG. 3 allow the detection of faults within each mode respectively with reference to only one of the test signals P1 or P2 respectively. Thus, for example, the test signal P1 (which corresponds to the potential at connection 100*b*) is compared with a first, comparably low threshold value in Mode 2. In Mode 0 it is always checked whether the test signal P2 (which is generated according to the potential at connection 100*a*) is lower than a second threshold value which is somewhat higher than the first threshold value or whether it is higher than a third threshold value which is higher than the second threshold value. In Mode 1 test signal P1 essentially is observed and tested whether it is higher than the second threshold value. Here it can be checked whether test signal P2 is higher than a comparably high, fourth threshold value, in order to determine if switch 105, 205 switches properly.

Modes 1–3 described above serve to test the circuit arrangement of the actuator or the actuator itself. In another Mode 3 (not shown in FIG. 3) the comparably complex first control signal S1 can be checked. For this purpose a defined first control signal S1 is generated, and it is checked whether it is generated correctly. In order to prevent the actuator from actually being activated, switch 105, 205 is opened. The control device 112, 235–237 then generates a defined first control signal S1, for example a pulse-width modulated signal and checks the generated signal. For example, a pulse-width modulated signal can be generated with a defined pulse width ratio, and then it can be checked whether the edges of this signal appear as desired.

In order to carry out the testing procedure according to the invention, the control device 112, 235–237 and in particular the processing device 235 exhibit a testing device that generates the control signals S1, S1', S2 for setting one or several of the above-mentioned modes on the one hand and, on the other hand, passes on to the signal monitoring device 236 the required control signals (for example, beginning and end of the test, signal values that are to be expected or threshold values that are to be checked).

In addition, an interruption device may be provided, which interrupts or ends the described test (in particular setting the modes 0–3) when a request for actually using the actuator, for example according to the input signals 239, is detected.

Figure 4:
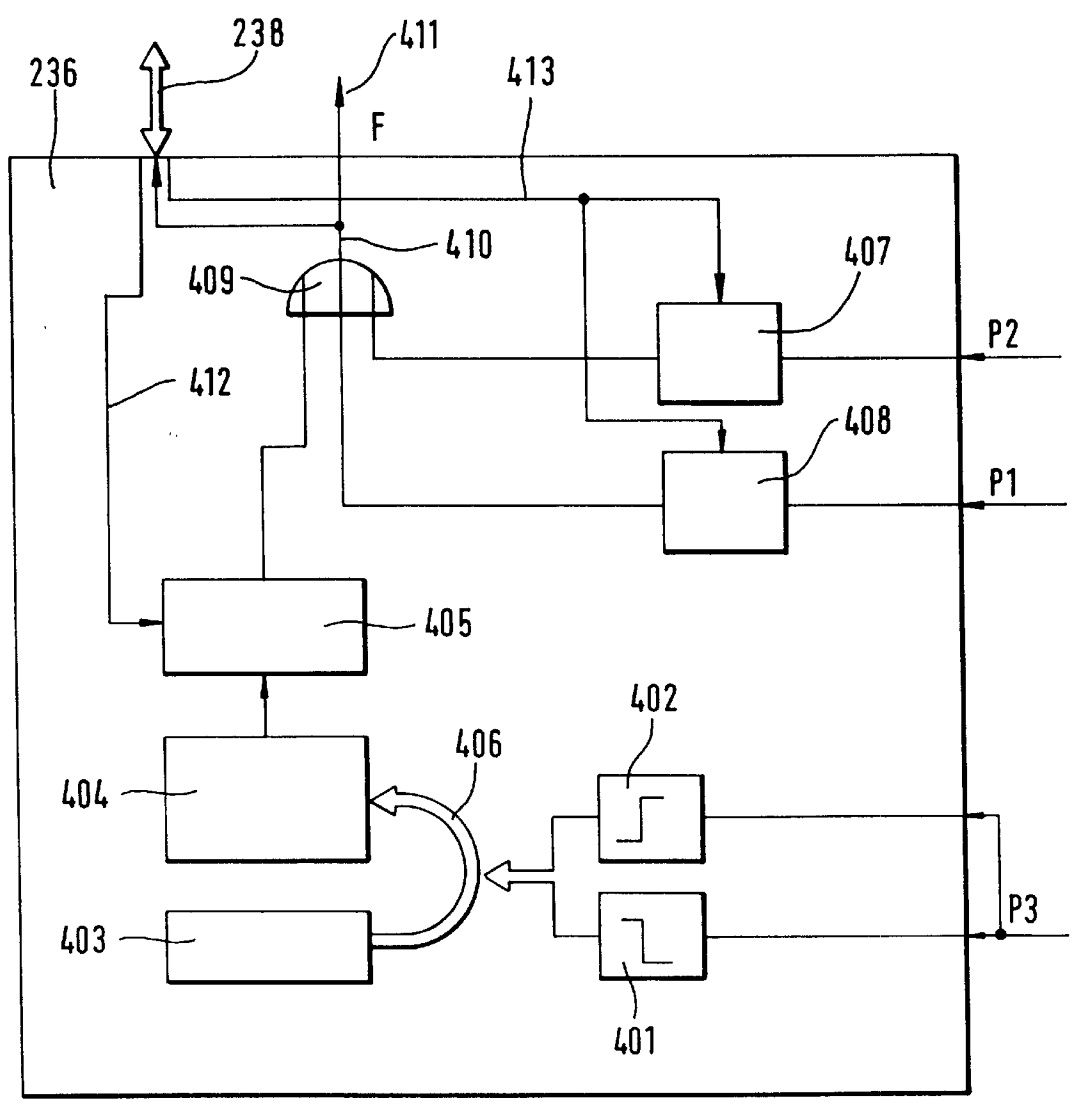
FIG. 4 shows an embodiment of a testing device.

FIG. 4 shows an embodiment of the signal monitoring device 236. The upper part shows devices for checking the test signals P1, P2 (concerning the circuit arrangement of the actuator or the actuator itself), the lower part shows devices for checking the first control signals S1, P3. These two parts of the circuit can be combined with one another (as shown). Also separate embodiments and only one of the two parts are possible.

As already described on the basis of FIG. 3, the test signals P1, P2 need to be compared to threshold values to check the circuit arrangement and the actuator itself. For this purpose, signal monitoring device 236 exhibits two comparators 407, 408 which monitor one or another signal respectively. Since, as shown in FIG. 3, only one fault signal needs to be monitored to be able to detect the respective faults, an embodiment may be provided, in which the two fault signals P1, P2 are directed to a single comparing device by means of a change-over switch. Threshold values can be passed on by way of signal lines 413 as can the query whether the signals exceed beyond or fall below such threshold values. The individual fault signals generated as the output of the comparing device 407, 408 can be combined into a fault signal F in a gate 409, with such fault signal F being output separately as signal 411 or being passed on via the phase 238 of the processing device 235.

The lower part of FIG. 4 shows a device for checking a pulse-width modulated signal (which is input as test signal P3). At first edge detectors 401, 402 are provided, with one corresponding to leading edges and one to trailing edges. In addition, a timing device 403 is provided. Whenever an edge is detected the instant of time determined at that moment is serially written into a memory 404 comprising several memory locations. This is schematically indicated by arrow 406. Consequently, memory 404 contains serial entries of instants of time which alternately mark the instant of leading and trailing edges. Memory 404, for example, can be designed like a shift register, into which data are continuously written, shifted according to the data written into it later and, finally, pushed out. Finally, an evaluation device 405 checks the correctness of the instants entered.

Theoretically a correct pulse-width modulation can be detected by the correct location of three successive edges. Consequently, the evaluation device 405 can be designed in such a way that it evaluates the correctness of the three latest entries in the memory 404 and then, when it has determined a fault, outputs a fault signal that, if necessary, can be combined into a joint fault signal F, 411 together with the fault signals from the comparing device 407, 408.

In order to avoid false alarms it may be useful to check the time-related location of additional groups of edges when a first irregularity is determined and to output a fault signal only when several faults are determined. The evaluation device 405 also can receive data via line 412, which provide required information, for example, the pulse width ratio that is to be expected.

The execution of the described test in the signal monitoring device 236 can be rendered dependent on the condition that the supply voltage lies within a defined range. Only then will it be ensured that testing the states of signals P1, P2 will lead to correct results when comparably few threshold values are set or they are set comparably close.

Processing device 235, generation device 237 and signal testing device 236 can be digital circuits based on different chips. Preferably, processing device 235 and signal testing device 236 can be identical chips that work redundantly in part, but carry out the above-described measures independently of another.

Mode 2 (both switches closed) preferably lasts less than 1 ms, even more preferably less than 500 μs.

The described test preferably is initiated periodically. For example, the first control signal S1 can be tested once per second or more frequently, preferably three times per second or more frequently. The same applies to the test of the circuit arrangement and actuator on the basis of test signals P1, P2.

One possibility of checking the first control S1, which takes the form of a pulse-modulated signal, is to generate a pulse-modulated signal with predefined pulse width ratio (ratio between on-times and off-times), with the entire cycle time being predefined, too. For example, a test control signal with a pulse width ratio of 33% can be set, where the on-time is 18 μs and the off-time is 36 μs. When these times are predefined, the signal testing device does not have to be informed as to which values are to be expected. At the same time, however, it may be desirable to generate flexible test signals. Preferably the generated test control signal S1 is non-symmetrical, i.e. has a pulse width ratio not equal to 50%. In addition, a device should preferably be provided, which ensures that the polarity of the signal is detected correctly. Thus it is ensured that an incorrectly generated test signal with a complementary pulse width ratio (for example 67% instead of 33%) is not acknowledged as being correct on the basis of the edge instant.

To the extent that the test of the circuit arrangement and the actuator on the basis of signals P1, P2 on the one hand and the test of the control signal S1 on the basis of signal P3 on the other hand are in principle provided together, these can be carried out alternately. Thus, for example, modes 0, 1, 2 and 3 can be set consecutively as described above, and each of the tests can be carried out within these modes. Here, too, repetition frequencies greater than 1 Hz, preferably greater than 3 Hz, are desirable. If not all of the above-mentioned tests are considered necessary, individual or several modes or various testing steps within these modes can be omitted.

If a fault is determined in one of the modes, this points to a fault in the circuit arrangement, the actuator or with respect to the generation of the first control signal. Accordingly appropriate counter-measures should be taken, for example output of an alarm signal or similar.

The sequence of the testing process can be controlled by a processor (not shown). Instead of the discrete structure of the circuit arrangement shown in FIG. 2, an integrated structure such as the one indicated by FIG. 1 may be provided.

What is claimed is:

1. An electrically controlled brake force booster, comprising:

an actuator having first and second electrical connections adapted to be connected between two voltage potentials a circuit arrangement for activating the actuator, said circuit arrangement including a first and a second line for supplying the voltage potentials to the first and second electrical connections of the actuator;

an electronically actuated first switch provided in the first line between the first potential and the first connection of the actuator; and a control device that switches the first switch with a first control signal, an electronically actuated second switch provided in the second line between the second potential and the second connection of the actuator, wherein the control device switches the second switch with a second control signal, wherein the control device generates a pulse-width modulated first control signal and comprises a processing device that generates a first output signal that indicates the pulse width ratio of the pulse-width modulation and a generation device that receives the first output signal and outputs the first control signal.

2. An electrically controlled brake force booster according to claim 1, further including a first signal line for leading the first control signal to a signal monitoring device.

3. An electrically controlled brake force booster according to claim 1, further including a second signal line leading to a signal monitoring device between the first switch and the first connection or the second switch and the second connection.

4. An electrically controlled brake force booster according to claim 3, wherein the signal monitoring device is an electronic circuit having the same design as the processing device and is adapted to exchange data with it.

5. An electrically controlled brake force booster according to claim 1, wherein the processing device includes a testing device for generating a suitable first output signal and a suitable second control signal for testing the circuit arrangement and the actuator or the pulse-width modulated first control signal.

6. An electrically controlled brake force booster according to claim 2, wherein the signal monitoring device comprises a first testing device for monitoring or evaluating the state changes of the pulse-width modulated first control signal.

7. An electrically controlled brake force booster according to claim 3, wherein the signal monitoring device comprises a second testing device for monitoring or evaluating the electric values on the second signal feedback.

8. An electrically controlled brake force booster according to claim 6, wherein the first testing device includes one edge detector respectively for leading and trailing edges of a digital signal as well as a timing device.

9. An electrically controlled brake force booster according to claim 8, wherein the first testing device exhibits a memory, into which the instants of the detected edges are written serially, and an evaluation device that evaluates at least three successive entries in the register.

10. A process for testing the circuit arrangement of an actuator of an electronically controlled brake force booster, which is adapted to be connected between two potentials and has two connections, as well as the actuator itself, wherein the circuit arrangement exhibits lines that supply the two potentials from a first and a second reference point as well as a first switch between the first reference point and the first connection of the actuator, a second switch between the second reference point and the second connection of the actuator, and a control device that switches the first and second switch preferably with a pulse-width modulated first control signal and a second control signal, comprising the steps of:

applying at least one potential on at least one connection of the actuator when both switches are open, keeping open the first switch and closing the second switch, and checking at least one potential on at least one connection of the actuator.

11. A process according to claim 10, further including the steps of:

closing the second switch and closing the first switch briefly, checking at least one potential on at least one connection of the actuator while the first switch is closed.

12. A process according to claim 11, wherein the first switch is kept closed less than 1 ms.

13. A process according to claim 11, further including the step of checking the potentials on both connections of the actuator.

14. A process according to claim 11, further including the step of checking the potential being tested against a threshold value.

15. A process for testing a pulse-width modulated first control signal for an actuator of an electronically controlled brake force booster that can be connected between two potentials and has two connections, wherein the circuit arrangement of the actuator exhibits lines that supply two potentials from a first and a second reference point as well as a first switch between the first reference point and the first connection of the actuator, a second switch between the second reference point and the second connection of the actuator, and a control device that switches the first and the second switch with the pulse-width modulated first control signal and a second control signal, comprising the steps of:

holding the second switch open, causing the generation of the pulse-width modulated first control signal with a defined pulse width ratio, and checking the time-related ratios between several edges of the generated first control signal and emitting a fault signal if the desired states are not detected.

16. A process according to claim 15, wherein the time-related ratios between three successive edges of the generated first control signal are checked.

17. A process according to claim 15, wherein at first checking the time-related ratios between edges of a first group of edges of the generated first control signal and then, if no desired states are detected, checking the time-related ratios between the edges of at least one second group of edges of the generated first control signal and then, if no desired states are detected, outputting the fault signal.

18. An electrically controlled brake force booster, comprising:

an actuator having first and second electrical connections adapted to be connected between two voltage potentials a circuit arrangement for activating the actuator, said circuit arrangement including a first and a second line for supplying the voltage potentials to the first and second electrical connections of the actuator;

an electronically actuated first switch provided in the first line between the first potential and the first connection of the actuator; and a control device that switches the first switch with a first control signal, an electronically actuated second switch provided in the second line between the second potential and the second connection of the actuator, wherein the control device switches the second switch with a second control signal, further including a second signal line leading to a signal monitoring device between the first switch and the first connection or the second switch and the second connection, wherein the signal monitoring device is an electronic circuit having the same design as the processing device and is adapted to exchange data with it.

19. An electrically controlled brake force booster, comprising:

an actuator having first and second electrical connections adapted to be connected between two voltage potentials a circuit arrangement for activating the actuator, said circuit arrangement including a first and a second line for supplying the voltage potentials to the first and second electrical connections of the actuator;

an electronically actuated first switch provided in the first line between the first potential and the first connection of the actuator; and a control device that switches the first switch with a first control signal, an electronically actuated second switch provided in the second line between the second potential and the second connection of the actuator, wherein the control device switches the second switch with a second control signal, further including a second signal line leading to a signal monitoring device between the first switch and the first connection or the second switch and the second connection, wherein the signal monitoring device comprises a second testing device for monitoring or evaluating the electric values on the second signal feedback.

* * * * *